US011551746B2

(12) United States Patent
He et al.

(10) Patent No.: US 11,551,746 B2
(45) Date of Patent: Jan. 10, 2023

(54) APPARATUSES INCLUDING MEMORY REGIONS HAVING DIFFERENT ACCESS SPEEDS AND METHODS FOR USING THE SAME

(71) Applicant: MICRON TECHNOLOGY, INC., Boise, ID (US)

(72) Inventors: Yuan He, Boise, ID (US); Daigo Toyama, Fujisawa (JP); Chikara Kondo, Hachioji (JP); Takehiro Hasegawa, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/953,214

(22) Filed: Nov. 19, 2020

(65) Prior Publication Data

US 2022/0157372 A1 May 19, 2022

(51) Int. Cl.
*G11C 7/12* (2006.01)
*G11C 11/4097* (2006.01)
(Continued)

(52) U.S. Cl.
CPC ........ *G11C 11/4097* (2013.01); *G06F 3/0604* (2013.01); *G11C 7/1048* (2013.01);
(Continued)

(58) Field of Classification Search
CPC .............. G11C 11/4097; G11C 7/1048; G11C 11/4093; G11C 11/4076; G11C 11/4096; G11C 11/4091
See application file for complete search history.

(56) References Cited

U.S. PATENT DOCUMENTS 8,885,416 B2   11/2014   Mui et al.
9,805,786 B1 * 10/2017   Saito .................. G11C 11/4096
(Continued)

FOREIGN PATENT DOCUMENTS

WO   2014062543 A2   4/2014
WO   2021173943 A1   9/2021

OTHER PUBLICATIONS

Kim, Suk Min et al., "Sensing Margin Enhancement Technique Utilizing Boosted Reference Voltage for Low-Voltage and High-Density DRAM", IEEE Transactions on Very Large Scale Integration (VLSI) Systems, vol. 27, No. 10, Oct. 2019, pp. 2413-2422.
(Continued)

*Primary Examiner* — Mushfique Siddique
(74) *Attorney, Agent, or Firm* — Dorsey & Whitney LLP

(57) ABSTRACT

Apparatuses, systems, and methods for faster memory access regions. A memory array may have a first bank which has a greater access speed than a second bank. For example the first bank may have a reduced read latency compared to the second bank. The first bank may have structural differences, such as reduced word line and/or reduced global input output (GIO) line length. In some embodiments, the first and second bank may have separate bank pad data buses, and data terminals. In some embodiments, they may share the bank pads data bus, and data terminals. In some embodiments, when an access command is received for the first (faster) bank while an access command to the second (slower) bank is still processing, the access to the faster bank may interrupt the access to the slower bank.

19 Claims, 7 Drawing Sheets

(51) Int. Cl.
  *G11C 11/4091* (2006.01)
  *G11C 11/4096* (2006.01)
  *G11C 11/4093* (2006.01)
  *G11C 11/4076* (2006.01)
  *G11C 7/10* (2006.01)
  *G06F 3/06* (2006.01)

(52) U.S. Cl.
  CPC ...... *G11C 11/4076* (2013.01); *G11C 11/4091* (2013.01); *G11C 11/4093* (2013.01); *G11C 11/4096* (2013.01)

(56) References Cited

U.S. PATENT DOCUMENTS

| | | | |
|---|---|---|---|
| 10,248,592 B2 | 4/2019 | Mirichigni et al. | |
| 10,366,743 B1* | 7/2019 | Ho | G11C 11/4096 |
| 10,372,330 B1* | 8/2019 | Gans | G06F 12/0292 |
| 2004/0179418 A1 | 9/2004 | Hwang | |
| 2005/0226061 A1* | 10/2005 | Park | G11C 7/22 |
| | | | 365/194 |
| 2008/0002478 A1* | 1/2008 | Park | G11C 7/1048 |
| | | | 365/189.04 |
| 2009/0244988 A1 | 10/2009 | Ashizawa | |
| 2010/0177584 A1* | 7/2010 | Lee | G11C 8/12 |
| | | | 365/226 |
| 2010/0325375 A1* | 12/2010 | Ueno | G06F 13/1626 |
| | | | 711/158 |
| 2011/0205828 A1* | 8/2011 | Richter | G11C 11/4076 |
| | | | 365/230.03 |
| 2012/0057413 A1 | 3/2012 | Yun et al. | |
| 2013/0227229 A1* | 8/2013 | Ishikawa | G11C 7/1006 |
| | | | 711/154 |
| 2014/0204660 A1 | 7/2014 | Chandwani et al. | |
| 2016/0372166 A1* | 12/2016 | Lym | G11C 5/04 |
| 2018/0239531 A1* | 8/2018 | Lea | G11C 11/4091 |
| 2019/0385667 A1 | 12/2019 | Morohashi et al. | |
| 2021/0272620 A1* | 9/2021 | Barry | G11C 11/4091 |

OTHER PUBLICATIONS

International Search Report and Written Opinion for PCT Application No. PCT/US2021/019833, dated Jun. 22, 2021.
U.S. Appl. No. 17/186,797 titled "Apparatuses and Methods for Address Based Memory Performance" filed Feb. 26, 2021, pp. al pages of application as filed.
International Search Report and Written Opinion for PCT Appl. No. PCT/US2021/057756 dated Feb. 15, 2022.

* cited by examiner

APPARATUSES INCLUDING MEMORY REGIONS HAVING DIFFERENT ACCESS SPEEDS AND METHODS FOR USING THE SAME

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). A memory device may have various performance characteristics for writing information to a memory cell and/or reading information from a memory cell. For example, a time required to read/write a reliability of information stored in a memory cell, power consumption to read/write etc. There may be various trade-offs involved in improving the performance of a memory. For example, reducing read/write times may involve increasing a cost of the memory. Since it may be impractical to increase the performance of an entire memory array, there may be a need to increase the performance of certain regions of the memory array relative to other regions of the memory array.

Memory devices may include a memory array which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses.

A memory device may have certain performance characteristics for access operations on the memory cells of the device. For example, characteristics may include a time it takes to write information to a given memory cell, the time it takes to read information from a given memory cell, reliability of information read from a memory cell, power consumed while writing or reading information, etc. A device including a memory array may have specified characteristics, which may be based, in part, on the lowest performance characteristics of a memory cell in the array. For example, if it takes longer to write/read data to some memory cells than others, then the overall performance of the memory may be based on the memory cell with the slowest read/write times such that the overall performance specification is based on a maximum time it takes for an access operation to any memory cell of the array. While increased performance characteristics are generally desirable, it may be impractical (e.g., too costly) to improve the performance of all of the memory cells of a memory device in order to improve the overall performance of the entire device.

DETAILED DESCRIPTION

Figure 1:
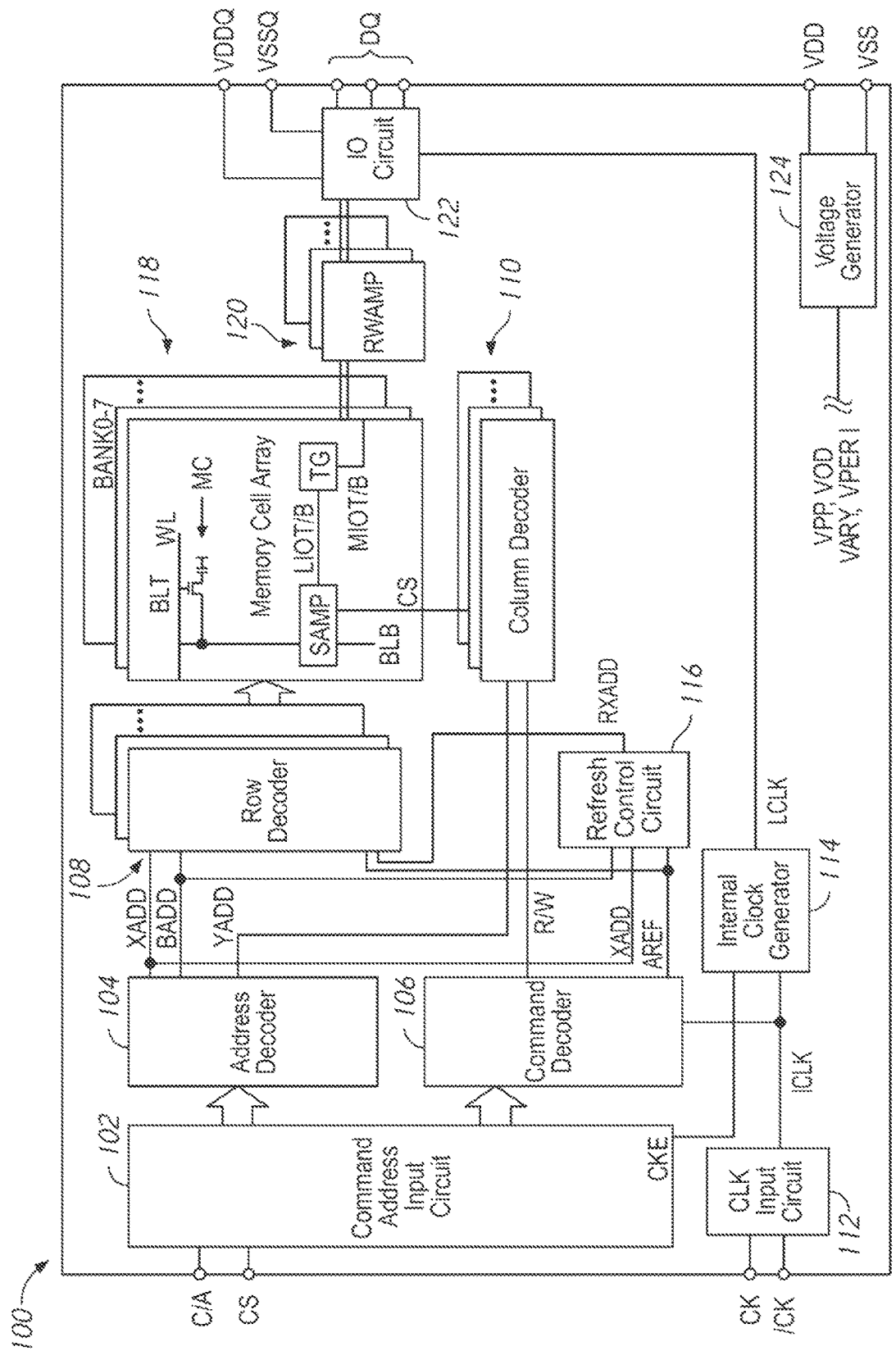
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only b the appended claims.

The present disclosure is drawn to apparatuses, systems, and methods for faster memory access regions. The memory array may be organized into memory banks. A first memory bank of the memory array may have a first access time, while a second memory bank has a second access time. The first memory bank may have memory cells at the intersection of word lines and digit lines, the word lines having a first length. The second memory bank may have memory cells at the intersection of word lines and digit lines, the word lines having a second length different (e.g., longer) than the first length. The first memory bank may be coupled by one or more global input/output (GIO) lines having a first length to a data bus, while the second memory bank may be coupled by one or more GIO lines, having a second length different (e.g., longer) than the first length. The different lengths of word lines and/or GIO lines may cause the memory cells of first memory bank to have an access speed faster than the memory cells of the second bank. In some embodiments, the memory array may have banks with different lengths of word line, different lengths of GIO lines or both.

In some embodiments, the first bank and the second bank of the memory array may have separate bank pads (for receiving commands/addresses) and separate data terminals (e.g., DQ pads). Accordingly, the memory may separately send and receive information along different data terminals. The memory banks may generally operate separately, but may share a die, along with various components such as voltage generators etc.

In some embodiments, the first bank and the second bank may share one or more components along the data path. For example, the first memory bank may be coupled by the first GIO line to a global data bus, and the second memory bank may be coupled by the second GIO ling to the same global data bus. When data is accessed from the first (faster) memory bank, it may interrupt data from the second (slower) memory bank. For example, the memory may receive an access command for memory cells of the second memory bank and then receive an access command for memory cells of the first memory bank. The memory may provide a first portion of the data associated with the second memory bank along the data terminal, then provide the data associated with the first memory bank, and then provide the remainder of the data associated with the second memory bank.

As used herein it should be understood that terms such as 'fast', 'slow', 'faster', 'slower', 'high-speed', and 'normal' are for comparative purposes only. For example, a bank described as 'slow' is only meant to indicate that that bank operates a slower speed than a bank described as 'fast', not that the slow bank is slow in absolute terms, Banks described as 'slow' may still operate in a rapid fashion.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BLT and BLB, and a plurality of memory cells MC arranged at intersections of the plurality of word lines WL and the plurality of bit lines BLT and BLB. The selection of the word line is performed by a row decoder 108 and the selection of the bit lines BLT and BLB is performed by a column decoder 110. In the embodiment of FIG. 1, the row decoder 108 includes a respective row decoder for each memory bank and the column decoder 110 includes a respective column decoder for each memory bank. The bit lines BLT and BLB are coupled to a respective sense amplifier (SAMP). Read data from the bit line BLT or BLB is amplified by the sense amplifier SAMP, and transferred to read/write amplifiers 120 over complementary local data lines (LIOT/B), transfer gate (TG), and complementary main data lines (MIO/B). Conversely write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit BLT or BLB.

The semiconductor device 100 may employs plurality of external terminals, such as solder pads, that include command and address (C/A) terminals coupled to a command and address bus to receive commands and addresses, and a CS signal, clock terminals to receive clocks CK and /CK, data terminals DQ coupled to as data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits.

The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded banks address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command address input circuit 102. The command decoder 106 includes circuits to decode the internal command signals to generate various internal signals and commands far performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when as external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired it timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
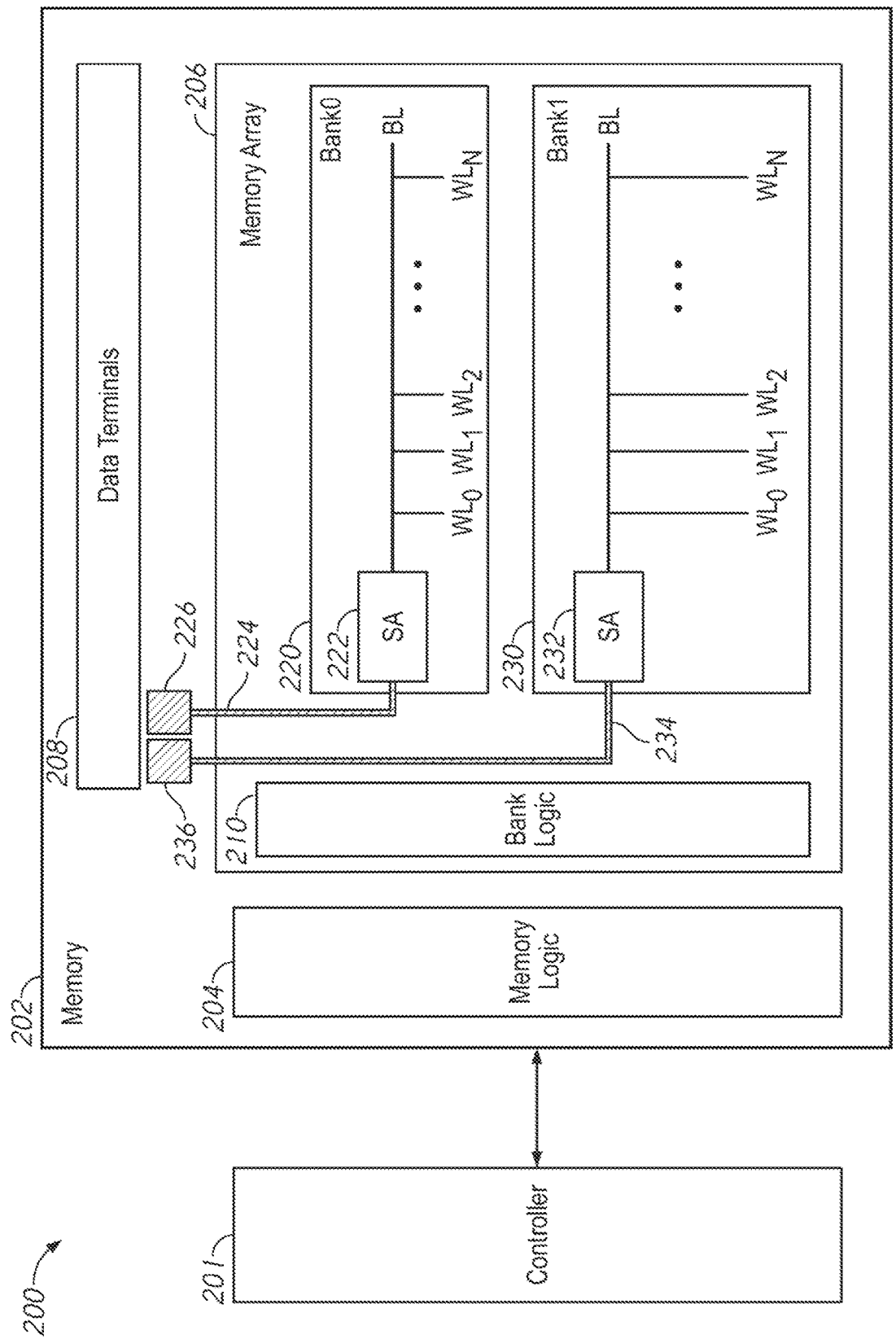
FIG. 2 is a block diagram of a memory system according to some embodiments of the present disclosure.

FIG. 2 is a block diagram of a memory system according to some embodiments of the present disclosure. The mentor system includes a controller 201 and a memory device 202. The memory device 202 may, in some embodiments, be included in the memory device 100 of FIG. 1. The memory device 202 may represent a simplified view of a memory device, and various components such as those shown in FIG. 1 may not be shown again or discussed in regards to FIG. 2.

The memory device 202 includes memory logic 204, which may be used to process commands received from the controller and/or perform various operations (such as refreshing) on the memory array 206. For example, the memory logic 204 may include components such as a refresh control circuit (e.g., 116 of FIG. 1), row and column decoder (e.g., 108/110 of FIG. 1), and/or command and address input circuits/decoders (e.g., 102, 104, and 106 of FIG. 1). The memory logic 204 may communicate with the memory array 206 through bank logic 210. The bank logic 210 may include various circuits associated with a specific bank, such as bank pads, which may be terminals which may receive various command signals associated with the banks.

The memory array 206 includes a first bank 220 and a second bank 230. Each bank may include respective components. For example, the first bank 220 may have a bit line (BL) intersecting a number of word lines (WL). Information may be read out along the bit line BL to a sense amplifier 222 and then along a global input/output (GIO) line 224. A GIO driver 226 may control a voltage along the GIO line 224. The GIO line 224 may send and receive data to data terminals 208 (e.g., the DQ pads of FIG. 1). Similarly, the second bank 230 may have its own word lines and bit lines, sense amplifier 232, GIO 234, and GIO driver 236. In other embodiments, other components may be specific to each bank (e.g., there may be two sets of bank pads and/or two sets of data terminals) and/or different components may be shared between banks. For the sake of brevity and clarity, certain components (e.g., a global data bus) have been omitted from the view of FIG. 2.

Each of the banks 220 and 230 includes a number of memory cells, disposed at the intersection of that bank's bit lines and word lines. FIG. 2 shows only a single bit line in each bank for the sake of brevity. More bit lines may be used in other embodiments. In some embodiments, different banks may have different numbers of memory cells. For example, the bank 220 may have fewer memory cells than the bank 230. For example, the bank 220 may have fewer digit lines, fewer, word lines, shorter digit lines, shorter word lines, or combinations thereof.

The memory bank 220 may have a faster access speed than the bank 230. The different speeds may be based, at least in part, on physical differences between the banks 220 and 230. For example, the word lines of the first memory bank 220 may be physically shorter than the word lines of the second memory bank 230. The shorter word lines of the first memory bank 220 may have a reduced RC characteristic compared to the longer word lines of the second memory bank 230. Accordingly, during a read operation it may be faster to change a voltage of the word line (e.g., when opening or closing a word lines). The different memory banks 220 and 230 may also (or alternatively) be associated with GIO lines 224 and 234 respectively, of different lengths. The shorter GIO line 224 of the first memory bank 220 may have a reduced RC characteristic, and therefore lower latency than the longer GIO line 234 of the second memory bank 230. In some embodiments, the shorter GIO line 224 may have a less powerful/less complicated GIO driver 226 when compared to the GIO driver 236 of the longer GIO line 234.

While only a pair of banks 220 and 230 are shown, in some embodiments, the memory array 206 may have a greater number of memory banks. For example, the memory array 220 may have a first number of banks similar to the first bank 220 (e.g., with a first access speed), and may have a second number of banks similar to the second bank 230 (e.g, with a second access speed). In some embodiments, the memory array 220 may have a first bank 220 and a large number banks similar to the second bank 230. Bank, row, and column addresses may be used to determine whether a given memory cell is in a faster memory bank (e.g., bank 220) or a slower memory bank (e.g., bank 230). Accordingly, the controller 201 may know the speed at which information is retrieved based on the address(es) it supplies along with an access command.

For example, the controller 201 may send a read command with a bank address associated with the first bank 220 (e.g., BADD0), along with row and column addresses. Data from the specified memory cells in the first bank 220 would be read along the bit line BL to the sense amplifier 222, out along the GIO line 224 to the data terminals 208. Based on a read latency of the first bank 220, the controller would expect data from the first bank 220 after a first number of clock cycles have passed. Similarly, if the controller 201 sends a read command along with a bank address BADD1 associated with the second bank 230, the controller 201 would expect data at the data terminals 208 to arrive after a second, different, number of clock cycles (e.g., more clock cycles than when the first bank 220 is accessed).

In some embodiments, the controller 201 may manage the storage of information based on the expected retrieval speed. For example, information which is considered more important and/or is more frequently accessed may be stored in the first bank 220, to increase the speed at which that information can be retrieved. In some embodiments, the controller 201 may move information from the second bank 230 into the first bank 220 and vice versa, for example based on usage patterns of the data. In some embodiments, the controller 201 may include knowledge about the latency of the different banks of the memory 202. In some embodiments, the memory 202 may include storage (e.g., a mode register) which includes information about the banks 220 and 230, which may be read by the controller 201 so that the controller 201 can use that information to manage operations of the memory 202.

In some embodiments, information from the first bank 220 may interrupt data being retrieved from the slower second bank 230. For example, the controller may send an access command to the second bank 230, and then send an access command to the first bank 220. The controller 201 may receive a first portion of the data associated with the access command to the second bank 230, receive the data associated with the access command to the first bank 220, and then receive the remainder of the data associated with the access command to the second bank 230. The memory logic 204 may include one or more arbiter circuits (e.g., in the command decoder 102) which may manage the signals involved in interrupting data from the first access command.

It should be understood that FIG. 2 is an example block diagram only, and that the layout and arrangement of parts does not necessarily represent a physical layout. For example, the bank logic 210 may be spread out across the chip, and ma include components which may be located near the data terminals 208 in some example layouts.

Figure 3:
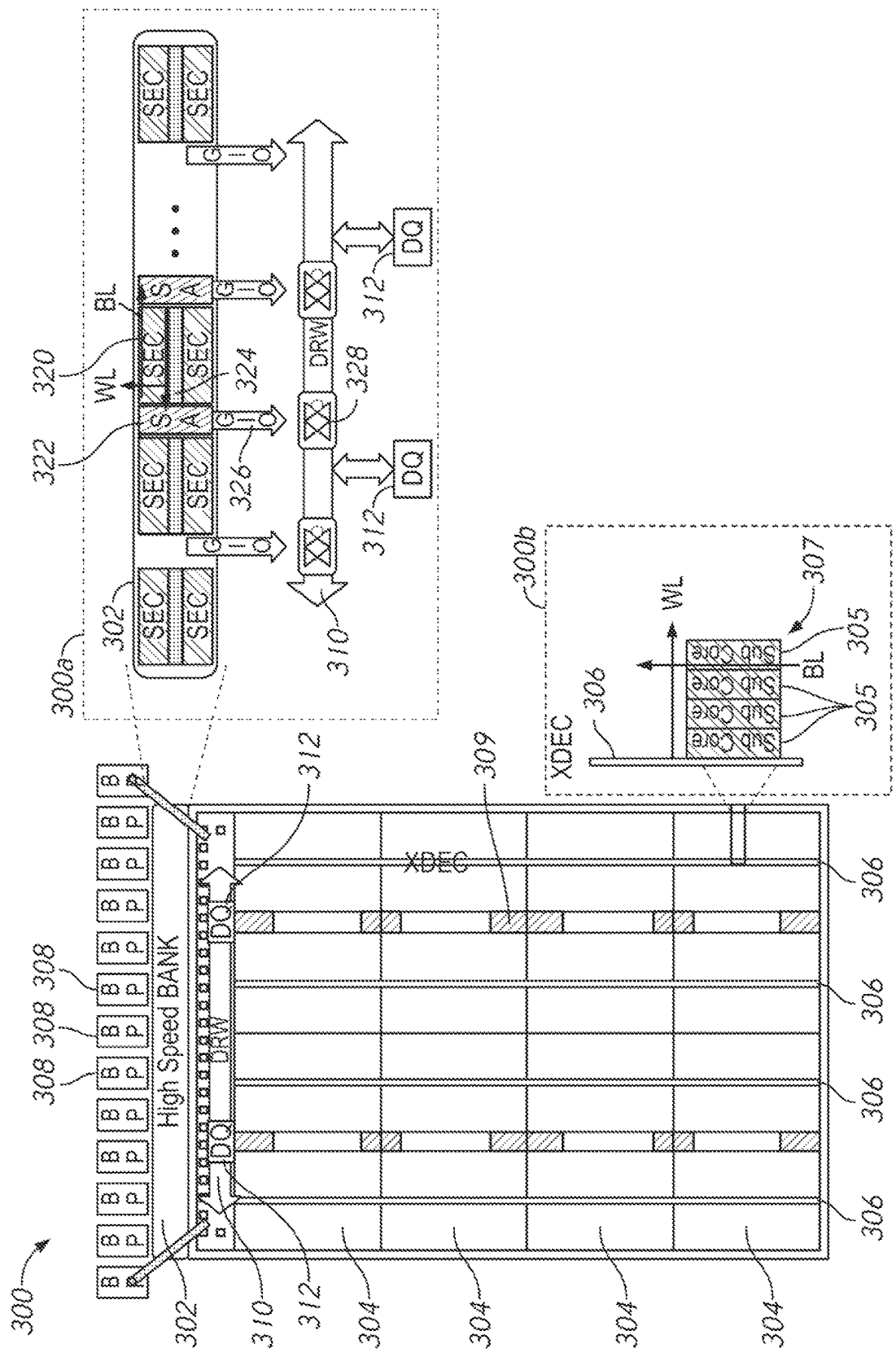
FIG. 3 is a schematic diagram of an example memory device layout according to some embodiments of the present disclosure.

FIG. 3 is a schematic diagram of an example memory device layout according to some embodiments of the present disclosure. The memory device 300 may, in some embodiments, be included in the memory 100 of FIG. 1 and/or the memory 202 of FIG. 2. The view of FIG. 3 may represent an example layout of a portion of a memory die including a memory array. The example embodiment of FIG. 3 includes 16 banks 304, and a high-speed bank 302. Different numbers of banks of each type may be used in other example embodiments.

The memory device includes a highspeed bank 302 (e.g., bank 220 of FIG. 2) and a number of 'normal' banks 304 (e.g., bank 230 of FIG. 2). The banks of the memory device 300 share a set of bank pads 308, a global data bus 310, and data terminals (DQ) 312. The bank pads 308 may receive command and addresses which direct access to one or more memory cells based on a received row, column, and bank address. If the command is a write command, then data received on the data terminals 312 provided along the global data bus 310 and distributed to the specified bank(s). If the command is a read command, then data may be retrieved from the specified bank(s) provided to the global data bus 310, where it may then be read out along the DQ pads 312.

The high-speed bank 302 may have a faster speed than the normal banks 304. For example, the high speed bank 302 may have a reduced read latency. Accordingly, when a read command is received at the bank pads 308 which includes a bank address associated with the high speed bank 302, the data may arrive at the data terminals 310 in a shorter time (e.g., fewer clock cycles) than if the read command was associated with the normal banks 304.

In some embodiments, the memory device 300 may interrupt data at the data terminals 312 being received from one of the normal banks 304 with data received from the high-speed bank 302. For example, a first read command may be received associated with one of the normal banks 304. Data from the normal bank 304 may be transmitted along a GIO line 309 to the global data bus 310 and to the DQ pads 312. A given read command may be associated with a number of bits of data for each DQ pad 312. For example a read command directed at the normal bank 304 may be associated with 8 bits of data provided serially at a given DQ pad 312. The memory 300 may receive a second read command associated with the high-speed bank 302, while it is still processing the first read command. Since the read latency of the high-speed bank 302 is lower than the normal banks 304, data associated with the second read command may be ready while the data from the first read command is still being sent to the DQ pads 312. The memory 300 may interrupt the data from the first read command to provide the data from the second read command, and then complete providing the data from the first read command. The timing of an example interrupt operation is discussed in more detail in FIG. 4.

The high speed bank 302 may have an increased access speed (e.g., a smaller read latency) compared to the normal bank 304 due to differences in the structure of the banks and layout of the banks relative to the DO pads 312. FIG. 3 includes a first inset 300*a* which shows the high speed bank 302 (as well as certain other components in the data path) in more detail, and a second inset 300*b* which shows a portion of an example normal bank 304 in more detail.

The inset 300*b* shows a portion of one of the normal banks 304. In particular one section 307 of the memory bank 304 is shown. The section may be adjacent to a row decoder (XDEC) 306 (e.g., 108 of FIG. 1). The section 307 may have word lines WL and bit lines BL. Example axes are shown to illustrate the direction in which the WL and BE are laid out. Each section 307 may have a number of sub-cores 305. For example, there may be four sub-cores 305, aligned side-by-side in the WE direction along the section 307. Accordingly, each sub-core 305 may have a portion of the word line which is a quarter of the length of the total word line.

The bit lines BL of the section 307 may be coupled to a sense amplifier region (not shown). During an access operation, the row decoder 306 may open one or more word lines WL, and then the data on those memory cells may be accessed by the sense amplifier(s) coupled to bit lines which intersect the opened word line(s). Data from the sense amplifiers may be sent and received to/from the global data bus 310 along a GIO line 309 associated with that bank.

The inset 300a shows the high-speed bank 302 and various other components of the data path. The high-speed bank 302 includes a number of sections 320. Each section includes a number of memory cells arranged at the intersection of a number of word lines, elongated along a direction marked WL, and a number of bit lines elongated along a direction marked BL. The word lines may be coupled to a row decoder 324, and the bit lines may be coupled to a sense amplifier in a sense amplifier (SA) region 322. In the example layout of the bank 302, two sections 320 may be arranged on opposite sides of a row decoder 324, and an SA region 322 may separate adjacent pairs of sections 320.

In some embodiments, each section 320 may be generally similar (e.g., in size, shape, and/or layout) to the sub-core 305 of a normal bank 304. For example, the section 320 may have a same number of word lines as a section 307 of a normal bank 304, however the section 320 may have word lines which are shorter in length than the word lines of the section 307. The shorter word lines may reduce an RC characteristic of the word line compared to the word lines of the section 307. Accordingly, the word lines of the sections 320 may have a lower latency than the word lines of the section 307. For example, the word lines of the section 320 may be the same length as the word lines in the sub-core 305 (e.g., ¼ the length of the overall word lines in the section 307). Accordingly, the section 320 may include fewer memory cells (e.g., ¼ as many) as the section 307 of the normal bank 304. Other arrangements of the sections 320 and 307 may be used in other example embodiments. It may be advantageous for the sections 320 of the high speed bank 302 to mimic one or more components of the normal bank 304 (e.g., to mimic a sub-core 305) to make layout and design considerations easier.

During access operations, data may be transmitted along a global data bus 310 to and from GIO lines 326 associated with the SA region 322 associated with the access command. The GIO lines 326 which couple the high speed bank 302 to the global data bus 310 may be shorter than the GIO lines 309 which couple the normal banks 304 to the global data bus 310. In a fashion analogous to the shorter word lines previously described, the shorter GIO lines 326 may also have a reduced RC characteristic, and therefore a reduced latency, compared to the GIO lines 309.

In the example of FIG. 3, the high speed bank 302 has both shorter word line length, and a reduced GIO line length compared to one of the normal banks 304. The reduced word line and GIO line lengths may work synergistically to reduce the overall latency of the bank. For example, as the read operation is performed, the shorter word lines may act to increase the speed at which new data is available to the GIO lines, while the shorter GIO lines may make it easier for the GIO drivers to detect that data and provide it to the data bus.

Various switches and amplifiers may determine which of the GIO lines 309 and 326 are coupled to the global data bus 310. For example, each GIO line 309 or 326 may be associated with a GIO driver. As shown in the inset 300a, each GIO line 326 may be associated with a GIO driver 328 (e.g., 226 of FIG. 2). Similarly, each GIO line 309 is associated with a GIO driver (e.g., 236 of FIG. 2), but those are not shown in FIG. 3. The GIO drivers may be operated by various control signals which may be provided, for example, by a command decoder (e.g., 106 of FIG. 1). The GIO drivers may act as switches to control which GIO line is coupled to the global data bus based on the signals received from the command decoder. The GIO drivers may also control a voltage along the GIO line.

In some embodiments, the GIO drivers 328 coupled to the GIO lines 326 may be less complicated, smaller, lower power or combinations thereof than the GIO drivers coupled to the GIO lines 309. Since the GIO lines 326 are much shorter, it may be relatively easy to drive a voltage of the GIO line 326. For example, in some embodiments, the GIO drivers 328 may include an inverter circuit, while the GIO drivers of the GIO lines 309 may include a data sense amplifier (DSA). Example GIO drivers are discussed in more detail in FIG. 5.

Figure 4:
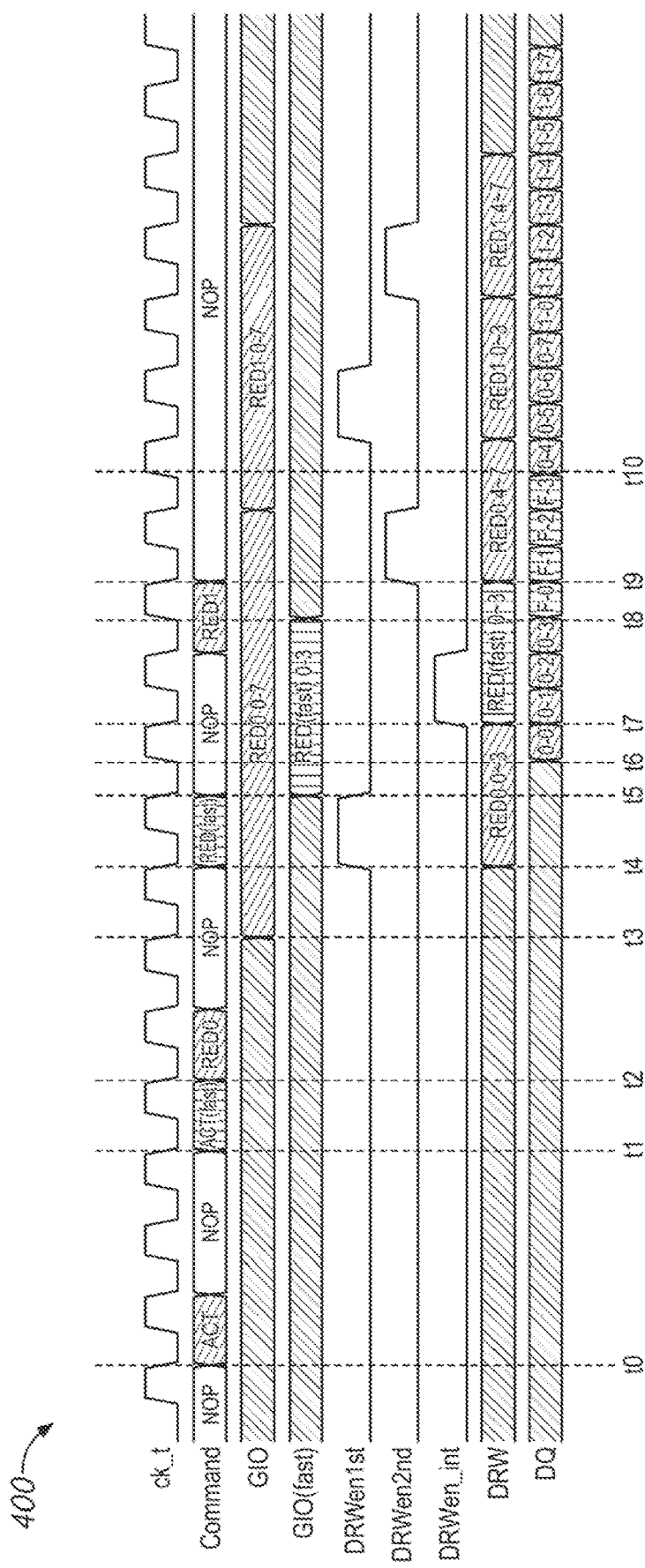
FIG. 4 is a timing diagram of an example read operation according to some embodiments of the present disclosure.

FIG. 4 is a timing diagram of an example read operation according to some embodiments of the present disclosure. The timing diagram 400 shows an example read operation including an interrupt operation, which may, for example, be implemented by one or more of the memories of FIGS. 1-3.

In particular, the timing diagram 400 may represent the operation of a memory, such as the memory 300 of FIG. 3, where the data terminals and global data bus are shared between a fast bank (e.g., bank 302 of FIG. 3) and a slow bank (e.g. one of the banks 304 of FIG. 3). The timing diagram 400 represents an interrupt operation, where a read operation to the high speed (e.g., fast) bank is received while the memory is processing a previous read operation directed to the normal bank.

The timing diagram 400 shows time extending along a horizontal axis, and various signals and command represented by different traces. The first trace is a clock signal ck_t which may be used to manage the timing of various operations. The next trace represents commands received (e.g., at the bank pads). While addresses are not shown in the timing diagram 400, the commands (and data) have been shaded and labeled to indicate which banks they are associated with. Commands and data marked fast (or F) are associated with the high speed bank.

The third and fourth trace represent the data along the GIO associated with the normal bank (e.g., GIO line 309 of FIG. 3) and the data along the GIO associated with the fast bank (e.g., GIO line 326 of FIG. 3) respectively. The fifth, sixth, and seventh traces represent control signals which may be used to operate GIO drivers. The fifth trace represents a signal DRWen1st which is used to signal a GIO driver associated with the normal bank to provide a first portion (e.g., a first half) of the read data to the global data bus, and the next trace DRWen2nd signals the GIO driver to provide the second portion (e.g., the second half) of the read data. The signal DRWen_int signals the GIO driver associated with the high speed bank to provide its data to the global data bus. The signals DRWen1st, DRWen2nd, and DRWen_int may be generated by an arbiter circuit, which may, for example, be located in a command decoder. The final traces of the timing diagram 400 represent the data along the global read write bus DRW, and the data on a data terminal DQ.

At an initial time t0, the memory receives an activate command ACT which is associated with one of the normal memory banks (e.g., because it is associated with a bank address associated with a normal memory bank) on the command bus (e.g., at the bank pads), At a time t1, which is before the memory has provided the data associated with the activate command received at t0, the memory may receive a second activate command which is associated with a high speed memory bank. At a second time t2, the memory may receive the read command (RED0) which indicates the memory cells to be read from the normal memory bank. This may cause data be read out from the specified memory cells. In the example embodiment of FIG. 4, a read command to the normal bank may be associated with 8 bits of information (and/or 8 bits per DQ terminal). After being read from the memory cells by the sense amplifier, at time t3, the read information from the normal bank may be transmitted along the GIO line associated with the normal bank.

At the time t4, the command bus may receive the read command RED(fast) associated with the high-speed bank (e.g., the read command as with the activate received at t1). An arbiter circuit (e.g., in the command decoder) may determine if the read command to the high speed bank should interrupt the read command to the normal bank. In some embodiments, read commands to the high speed bank may always interrupt read commands to a normal bank. The arbiter circuit may prepare to issue an interrupt sign1 DRWen_int, as described further herein.

Relating back to the read command to the normal bank, at t4, the signal DRWen1st may become active, which may cause a first portion of the data from the normal bank to be provided on the global data bus. The first four bits of the data from the normal bank RED0 0-3 may be provided along the global data bus.

At a time t5, the data read from the high speed bank begins being transmitted along the GIO line associated with the high speed bank.

At a time t6, the first four bits of the data associated with the read command to the normal bank begin being serially transmitted at the DQ pad (e.g., 0-0 to 0-3). Note that while the other commands were synchronized to a falling edge of the clock signal ck_t, the data at the data terminal is synchronized to both rising and falling edges of the clock signal ck_t. The time between the first rising clock edge after the read command RED0 to the normal bank (e.g, the first rising clock after t2) and the time t6 when the data begins being transmitted may represent a read latency RL. In the example of FIG. 4, the RL for a normal bank may be four clock cycles.

At a time t7, the arbiter circuit issues the interrupt signal DRWen_int at an active level. This causes the read data RED(fast) 0-3 from the high speed bank to be provided along the global data bus. Read commands associated with the high-speed bank may have a smaller number of bits than the read commands associated with the normal bank. In the example embodiment of FIG. 4, the read commands associated with the high speed bank may cause 4 bits to be read from the high speed bank (as compared to the 8 bits read out as part of a read command issued to the normal bank). At a time t8, the data from the high speed bank (F-0 to F-3) begins being serially transmitted err the DQ terminal. The read latency for the high speed bank RL(fast) may be shorter than the RL for the normal bank. For example RL(fast) may be 3 clock cycles (from the first rising clock edge after t4 to the rising clock edge at t8) while the RL for the normal bank may be 4 clock cycles.

At a time t9, after the data RED(fast) 0-3 is provided along the global data bus DRW, the arbiter circuit may activate the second burst signal DRWen2nd, which may cause the second half of the data associated with the normal ready command RED0, RED0 4-7 to be provided along the global data bus DRW. Subsequent to being provided along the global data bus, the remainder of the data associated with the RED0 command may be provided at the DQ terminal (e.g., 0-4 to 07). Accordingly considering the output along the DQ terminal, the bits provided may be 0-0 to 0-3, F-0 to F-3, and then 0-4 to 0-7, with the data from the high speed bank (F-0 to F-3) interrupting the bits 0-0 to 0-7 associated with the read command to the normal bank. As may be seen, when the memory receives a next read command to the normal bank (e.g., command RED1 at around time t8) without an access to the high speed bank to interrupt it, the bits from the normal batik may be provided. Sequentially (e.g., 1-0 to 1-7) without interruption.

Figure 5:
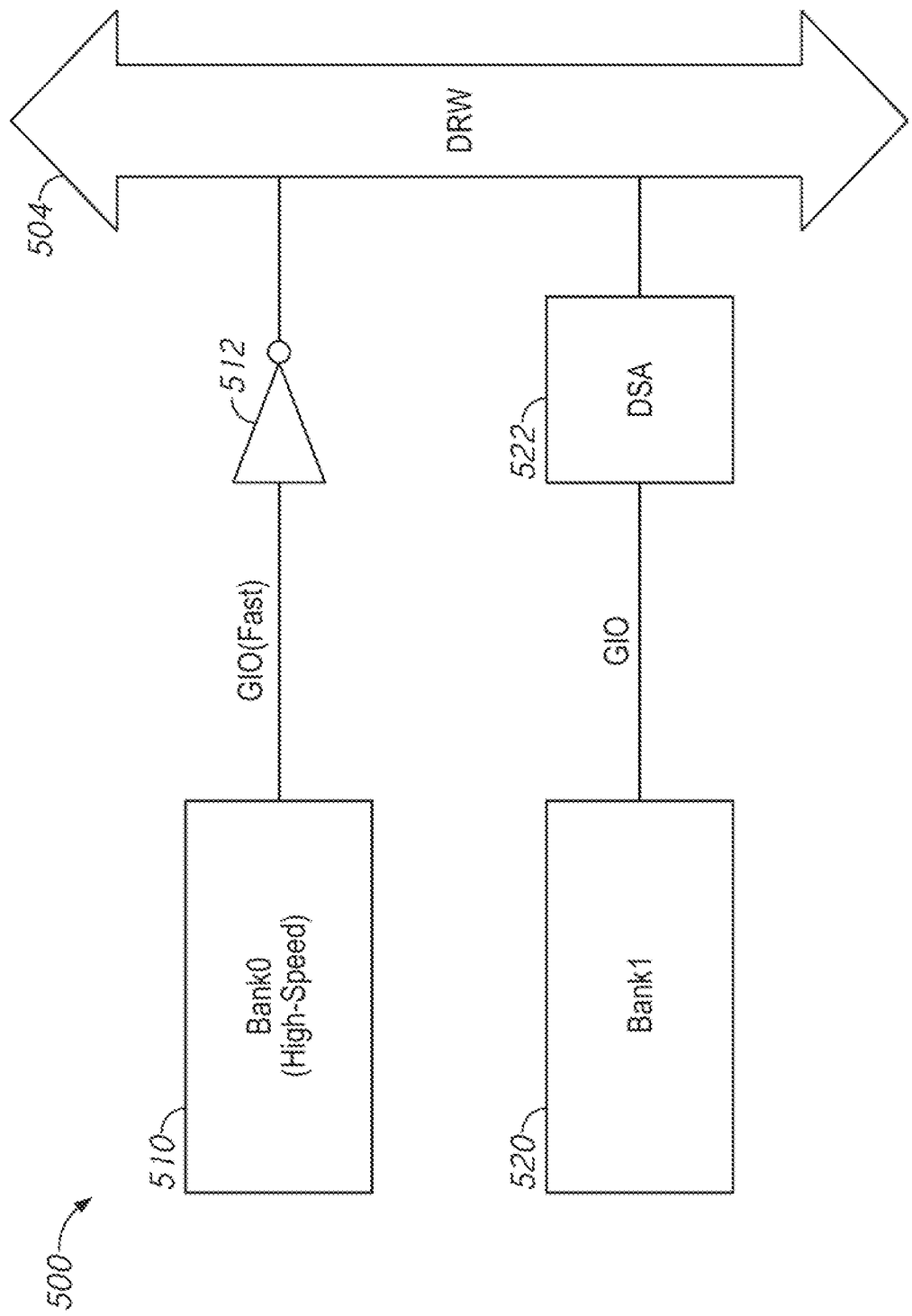
FIG. 5 is a block diagram of a portion of a data path of a memory according to some embodiments of the present disclosure.

FIG. 5 is a block diagram of a portion of a data path of a memory according to sortie embodiments of the present disclosure. The memory 500 may, in some embodiments, represent a portion of a memory, such as the memory 100 of FIG. 1, 202 of FIG. 2, and/or 300 of FIG. 3. The memory 500 includes a first bank 510, which is a high speed bank (e.g., 220 of FIG. 2 or 302 of FIG. 3) and a normal bank 520 (e.g., 230 of FIG. 2 or 304 of FIG. 3). Each bank is coupled by a respective GIO line to a respective GIO driver 512 and 522, respectively. The GIO drivers control a voltage along their respective GIO lines, and selectively couple those voltages to the global data bus DRW 504. Various components, such as switches control signals, etc., have been omitted from the view of FIG. 5.

One of the functions of the GIO driver is to sense a voltage along the GIO (e.g., the voltage level associated with a bit) and drive that voltage along the GIO line and to the DRW bus 504. For example, the sense amplifiers in the bank may drive the voltage onto the GIO line (along with transfer gates and other components), but the GIO line may be relatively long, and the sense amplifier may not be able to fully drive the level of the GIO line between the 'rail' voltages (e.g., a voltage which represents a logical high, and a voltage which represents a logical low). The GIO driver may detect a change in voltage along the GIO line and then drive the voltage of the GIO line fully to one rail or another.

Since the GIO line associated with the high speed bank 510 is shorter than the GIO line associated with the normal bank 520, the GIO line associated with the high-speed bank 510 may have a reduced RC characteristic. The amount of power required to drive the voltage on the GIO line between the rail voltages may be based, in part, on the RC characteristic of the GIO line. Accordingly, a lower power GIO driver may be used with the high-speed bank 510.

The GIO driver associated with the high-speed bank 510 may be an inverter circuit 512. The GIO driver associated with the normal bank 520 may be a data sense amplifier (DSA) 522. The inverter 512 may have a smaller size (e.g., comprise fewer transistors) and draw lower power compared to the DSA 522.

While the view of FIG. 5 shows an embodiment where the global data bus DRW 504 is shared between the high speed bank 510 and normal bank 520, different GIO drivers may also be used in embodiments where the DRW bus is not shared.

Figure 6:
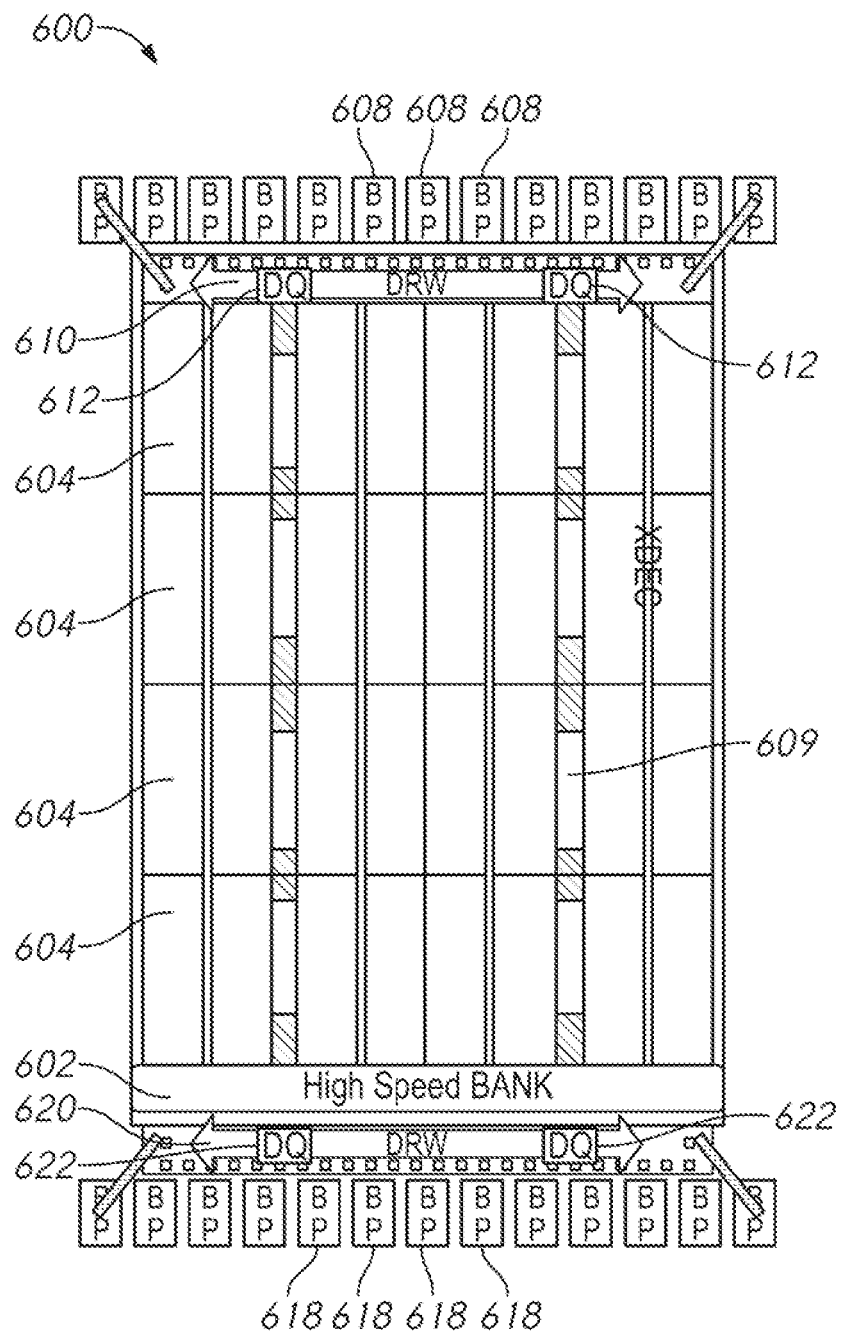
FIG. 6 is a schematic diagram of an example memory device layout according to some embodiments of the present disclosure.

FIG. 6 is a schematic diagram of an example memory device layout according to some embodiments of the present disclosure. The memory device 600 may, in some embodiments, be included in the memory device 100 of FIG. 1 and/or 202 of FIG. 2. The memory device 600 may be broadly similar to the memory device 300 of FIG. 3, except that the memory device 600 has a separate global data bus, bank pads, and data pads for the high speed bank. For the sake of brevity, components and operations previously described with respect to FIG. 3 will not be repeated again with respect to FIG. 6.

The memory 600 includes a number of 'normal' banks 604 which is coupled via GIO lines 609 to a global data bus 610 and through that to DQ pads 612. The normal memory banks 604 may receive command signals along bank pads 608.

The memory 600 includes a high-speed memory bank 602 which is coupled via GIO lines and drivers (not shown) to its own global data bus 620 and data terminals DQ 622. The high-speed memory bank 602 also has its own bank pads 618. The high-speed bank 602 may effectively operate a separate memory from the normal banks 604, even though they may sharp a physical die. Access commands may be separately directed to the different banks 604 and 602 by providing those commands to the different sets of bank pads 608 and 618 respectively, and sending and receiving data to the different banks along the different sets of DQ pads 612 and 622. The command decoder may send commands to the different bank pads 608 and 618 for example, based on the bank address associated with the different commands. While they may have separate components in the data path, the banks 602 and 604 may still share other components such as voltage supplies, clock signals, command address decoders.

Figure 7:
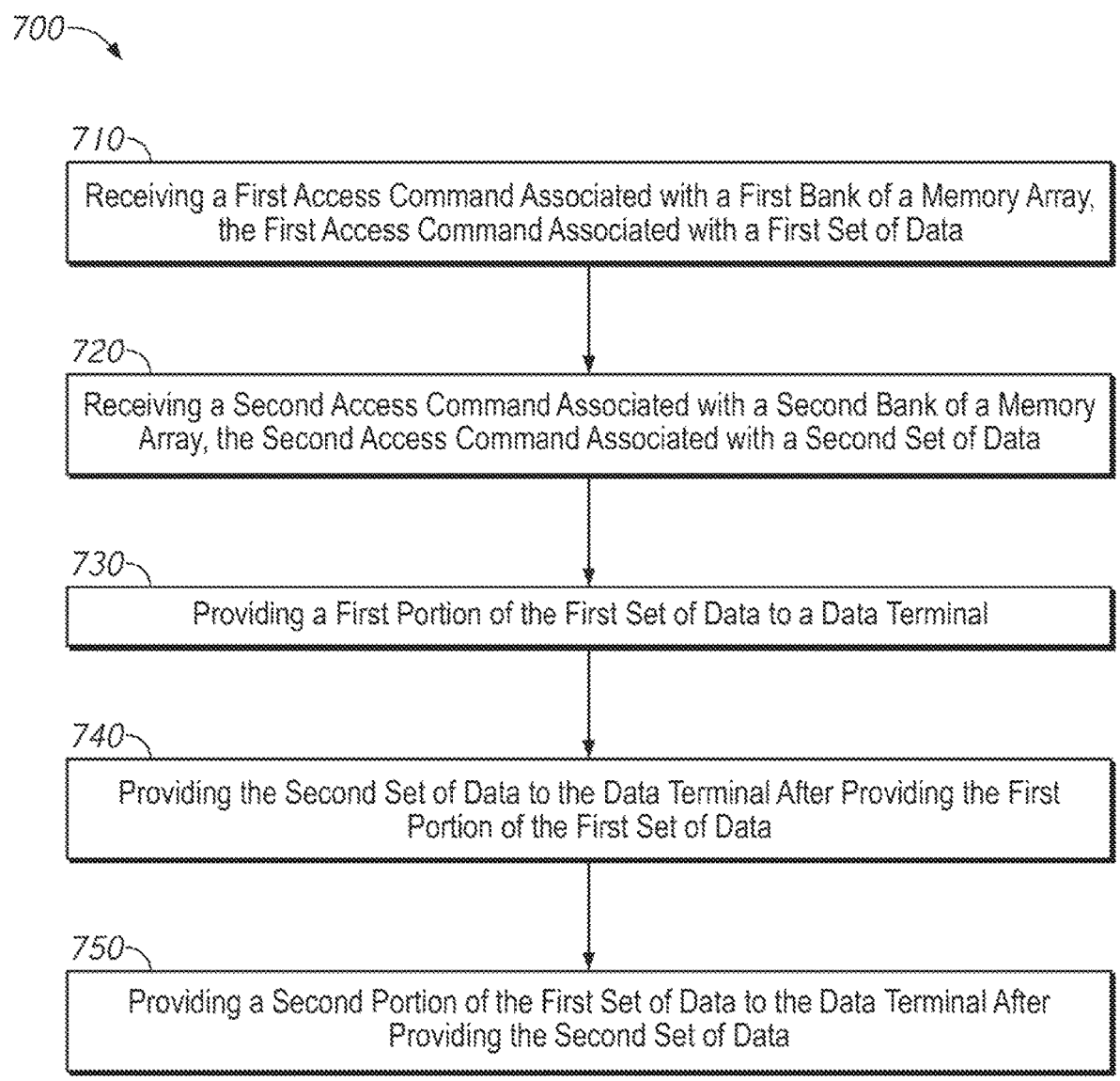
FIG. 7 is a flow chart depicting a method a interrupting data according to some embodiments a the present disclosure.

FIG. 7 is a flow chart depicting a method of interrupting data according to some embodiments of the present disclosure. The method 700 may, in some embodiments, be implemented by one or more of the apparatuses or systems described in FIGS. 1-5. The method 700 describes an operation where a data access to a high speed memory bank interrupts an access to a normal memory bank (e.g., similar to the operation depicted in FIG. 4).

The method 700 may generally begin with block 710, which describes receiving a first access command associated with a first bank of a memory array, the first access command associated with a first set of data. The first bank may be a normal memory bank (e.g., bank 230 of FIG. 2). The first set of data may be a number of bits associated with the read command e.g., 8 bits of data).

Block 710 may be followed by block 720, which describes receiving a second access command associated with a second bank of a memory array, the second access command associated with a second set of data. The second bank may be a high speed bank (e.g., bank 220 of FIG. 2). The second set of data may be the bits associated with a read command. In some embodiments, there may be fewer bits in the second set of data than in the first set of data. For example, the second set of data may include four bits.

Block 720 may generally be followed by block 730, which describes providing a first portion of the first set of data to a data terminal. The first portion may be associated with a first global bus enable signal (e.g., DRWen1st of FIG. 3) issued by an arbiter circuit (e.g., in the command decoder). The first portion may, in some embodiments, represent half of the data bits of the first set of bits. The bits may be provided to the data terminal a serial fashion, synchronized to rising and falling edges of a clock signal.

Block 730 may generally be followed by block 740, which describes providing the second set of data to the data terminal at providing the first portion of the first set of data. The second set of data may interrupt the first set of data on the data terminal. The second set of data may be provided, in part, due to the activation of an interrupt signal (DRWen_int of FIG. 3) issued by an arbiter circuit.

Block 740 may be followed by block 750, which describes providing a second portion of the first set of data to the data terminal after providing the second set of data. For example, the second portion may represent a remainder of the first set of data (e.g., a second half). Providing the second portion may be associated with a second global bus enable signal (e.g., DRWen2nd of FIG. 3) issued by the arbiter circuit.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:
1. An apparatus comprising:
a plurality of data terminals;
a first memory bank having a memory cell at the intersection of a first word line and a first bit line;
a second memory bank having a memory cell at the intersection of a second word line and a second bit line;
a first global input/output ((HO) line configured to couple the first bit line to the plurality, of data terminals, the first GIO line having a first length; and
a second GIO line configured to couple the second bit line to the plurality of data terminals, the second CIO line being separate from the first CIO line and having a second length different than the first length; and
an arbiter circuit configured to provide an interrupt signal based on a second access command directed to the first memory bank being received while a first access command directed to the second memory bank is being processed, wherein the interrupt signal causes the second access command directed to the first memory bank to be processed before processing a subsequent access command to the second memory bank.

2. The apparatus of claim 1, wherein the data terrain, is configured to send and receive data to/from a controller.

3. The apparatus of claim 1, wherein the first word line intersects a first number of memory cells, wherein the second word line intersects a second number of memory cells, wherein the first number is smaller than the second number, and wherein the first word line is shorter than the second word line.

4. The apparatus of claim 1,
wherein responsive to the interrupt signal, the first GIO line is electrically connected to the plurality of data terminals.

5. The apparatus of claim 1, further comprising a global bus configured to couple the first GIO line and the second GIO line to the plurality of data terminals.

6. The apparatus of claim 1, further comprising a set of bank pads configured to receive commands directed to the first and second memory banks and addresses of the first bank and the second bank.

7. The apparatus of claim 1, wherein the plurality of data terminals comprises:
a first data terminal configured to send and receive data to/from the first memory bank but not the second memory bank; and
a second data terminal configured to send and receive data to/from the second memory bank but not the first memory bank.

8. The apparatus of claim 7, further comprising:
a first set of bank pads configured to receive commands directed to the first memory bank but not the second memory bank and an address of the first memory bank; and
a second set of bank pads configured to receive commands directed to the second memory bank but not the first memory bank and an address of the second memory bank.

9. The apparatus of claim 1 further comprising:
an inverter circuit coupled to the first GIO line, the inverter circuit configured to drive a voltage of the first GIO line;
a data sense amplifier (DSA) coupled to the second GIO line, the DSA circuit configured to drive a voltage of the second GIO line, wherein the first GIO line is not coupled to a DSA.

10. The apparatus of claim 1, wherein the first length of the first GIO line is shorter than the second length of the second GIO line.

11. A memory die comprising:
a memory array comprising:
a first bank including a first word line having a first length;
a second bank including a second word line having a second length different, than the first length;
a first data terminal configured to send and receive data to/from the first bank and further configured to interrupt the data to the first bank responsive to an access command to the second bank, wherein the interruption causes a second access command directed to the second memory bank to be processed before processing a subsequent access command to the first memory bank; and
a second data terminal configured to send and receive data to/from the second bank.

12. The memory die of claim 11, wherein the first data terminal is configured to not send and receive data to/from the second bank, and wherein the second data terminal is configured to not send and receive data to/from the first bank.

13. The memory die of claim 11, further comprising:
a first set of bank pads configured to receive commands directed to the first bank and an address of the first bank; and
a second set of bank pads configured to receive commands directed to the second bank and an address of the second bank.

14. The memory die of claim 11, further comprising a first global input/output line (GIO) coupled to the first bank and a second GIO line coupled to the second bank, wherein the first GIO line is shorter than the second GIO line.

15. The memory die of claim 14, further comprising:
a first global data bus coupled between the first GIO line and the first data terminal; and
a second global data bus coupled between the second GIO line and the second data terminal.

16. A method comprising:
receiving a first access command directed to a first bank of a memory array, the first access command comprising a first set of data;
receiving a second access command directed to a second bank of a memory array, the second access command comprising a second set of data;
providing a first portion of the first set of data to a data terminal;
providing the second set of data to the data terminal after providing the first portion of the first set of data;
providing a second portion of the first set of data to the data terminal after providing the second set of data, wherein the first bank has a first access speed, and wherein the second bank has a second access speed, faster than the first access speed; and
generating an interrupt signal responsive to receiving the second access command while the first access command is being processed, wherein the second set of data is provided responsive to the interrupt signal.

17. The method of claim 16, further comprising:
providing the first set of data along a first global input/output (GIO) line to a data bus;
providing the second set of data along a second GIO line to the data bus.

18. The method of claim 16, wherein the first set of data includes more bits than the second set of data.

19. The method of claim 16, further comprising:
providing the first portion of the first set of data a first length of time after receiving the first access command; and
providing the second set of data a second length of time after receiving the second access command, wherein the second length of time is shorter than the first length of time.

* * * * *

UNITED STATES PATENT AND TRADEMARK OFFICE
CERTIFICATE OF CORRECTION

PATENT NO. : 11,551,746 B2  
APPLICATION NO. : 16/953214  
DATED : January 10, 2023  
INVENTOR(S) : Yuan He et al.

Page 1 of 1

It is certified that error appears in the above-identified patent and that said Letters Patent is hereby corrected as shown below:

In the Claims

| | Reads | Should Read |
|---|---|---|
| Column 14, Line 34, Claim 1 | "a first global input/output ((HO) line" | -- a first global input/output (GIO) line -- |
| Column 14, Line 38, Claim 1 | "the second CIO line being separate from the first CIO line" | -- the second GIO line being separate from the first GIO line -- |
| Column 14, Line 49, Claim 2 | "The apparatus of claim 1, wherein the data terrain" | -- The apparatus of claim 1, wherein the data terminal -- |

Signed and Sealed this  
Second Day of May, 2023

Katherine Kelly Vidal  
*Director of the United States Patent and Trademark Office*